United States Patent
Mohammed

(10) Patent No.: US 9,917,073 B2
(45) Date of Patent: Mar. 13, 2018

(54) RECONSTITUTED WAFER-LEVEL PACKAGE DRAM WITH CONDUCTIVE INTERCONNECTS FORMED IN ENCAPSULANT AT PERIPHERY OF THE PACKAGE

(71) Applicant: Invensas Corporation, San Jose, CA (US)

(72) Inventor: Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/196,635

(22) Filed: Jun. 29, 2016

(65) Prior Publication Data

US 2016/0307878 A1 Oct. 20, 2016

Related U.S. Application Data

(62) Division of application No. 13/563,085, filed on Jul. 31, 2012, now Pat. No. 9,391,008.

(51) Int. Cl.
*H01L 23/48* (2006.01)
*H01L 23/52* (2006.01)
(Continued)

(52) U.S. Cl.
CPC .... *H01L 25/0657* (2013.01); *H01L 23/49811* (2013.01); *H01L 23/49838* (2013.01);
(Continued)

(58) Field of Classification Search
CPC ... H01L 2224/8203; H01L 2225/06558; H01L 2225/06565
See application file for complete search history.

(56) References Cited

U.S. PATENT DOCUMENTS

| 3,289,452 A | 12/1966 | Koellner |
| 3,358,897 A | 12/1967 | Christensen |

(Continued)

FOREIGN PATENT DOCUMENTS

| CN | 1352804 A | 6/2002 |
| CN | 1641832 A | 7/2005 |

(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Ismail Muse
(74) *Attorney, Agent, or Firm* — Lerner, David, Littenberg, Krumholz & Mentlik, LLP

(57) ABSTRACT

A microelectronic package includes first and second encapsulated microelectronic elements, each of which includes a semiconductor die having a front face and contacts thereon. An encapsulant contacts at least an edge surface of each semiconductor die and extends in at least one lateral direction therefrom. Electrically conductive elements extend from the contacts and over the front face to locations overlying the encapsulant. The first and second microelectronic elements are affixed to one another such that one of the front or back surfaces of one of the first and second semiconductor dies is oriented towards one of the front or back surfaces of the other of the first and second semiconductor dies. A plurality of electrically conductive interconnects extend through the encapsulants of the first and second microelectronic elements and are electrically connected with at least one semiconductor die of the first and second microelectronic elements by the conductive elements.

14 Claims, 7 Drawing Sheets

(51) Int. Cl.
  *H01L 29/40* (2006.01)
  *H01L 25/065* (2006.01)
  *H01L 23/498* (2006.01)
  *H01L 25/10* (2006.01)
  *H01L 25/18* (2006.01)
  *H01L 23/00* (2006.01)

(52) U.S. Cl.
  CPC .............. *H01L 24/06* (2013.01); *H01L 24/24* (2013.01); *H01L 24/33* (2013.01); *H01L 24/73* (2013.01); *H01L 24/91* (2013.01); *H01L 24/92* (2013.01); *H01L 25/105* (2013.01); *H01L 25/18* (2013.01); *H01L 24/05* (2013.01); *H01L 24/16* (2013.01); *H01L 24/32* (2013.01); *H01L 2224/0233* (2013.01); *H01L 2224/02371* (2013.01); *H01L 2224/02379* (2013.01); *H01L 2224/02381* (2013.01); *H01L 2224/0401* (2013.01); *H01L 2224/04105* (2013.01); *H01L 2224/06181* (2013.01); *H01L 2224/12105* (2013.01); *H01L 2224/16145* (2013.01); *H01L 2224/16225* (2013.01); *H01L 2224/16235* (2013.01); *H01L 2224/24011* (2013.01); *H01L 2224/24147* (2013.01); *H01L 2224/293* (2013.01); *H01L 2224/2929* (2013.01); *H01L 2224/73217* (2013.01); *H01L 2224/73253* (2013.01); *H01L 2224/73259* (2013.01); *H01L 2224/821* (2013.01); *H01L 2224/8203* (2013.01); *H01L 2224/83855* (2013.01); *H01L 2224/9202* (2013.01); *H01L 2224/92144* (2013.01); *H01L 2225/06548* (2013.01); *H01L 2225/06558* (2013.01); *H01L 2225/06565* (2013.01); *H01L 2225/1023* (2013.01); *H01L 2225/1058* (2013.01); *H01L 2924/12042* (2013.01); *H01L 2924/15311* (2013.01); *H01L 2924/15321* (2013.01); *H01L 2924/18161* (2013.01); *H01L 2924/19107* (2013.01)

(56) References Cited

U.S. PATENT DOCUMENTS

| | | | |
|---|---|---|---|
| 3,430,835 A | 3/1969 | Grable et al. | |
| 3,623,649 A | 11/1971 | Keisling | |
| 3,795,037 A | 3/1974 | Luttmer | |
| 3,900,153 A | 8/1975 | Beerwerth et al. | |
| 4,067,104 A | 1/1978 | Tracy | |
| 4,213,556 A | 7/1980 | Persson et al. | |
| 4,327,860 A | 5/1982 | Kirshenboin et al. | |
| 4,422,568 A | 12/1983 | Elles et al. | |
| 4,437,604 A | 3/1984 | Razon et al. | |
| 4,604,644 A | 8/1986 | Beckham et al. | |
| 4,642,889 A | 2/1987 | Grabbe | |
| 4,695,870 A | 9/1987 | Patraw | |
| 4,716,049 A | 12/1987 | Patraw | |
| 4,771,930 A | 9/1988 | Gillotti et al. | |
| 4,793,814 A | 12/1988 | Zifcak et al. | |
| 4,804,132 A | 2/1989 | DiFrancesco | |
| 4,845,354 A | 7/1989 | Gupta et al. | |
| 4,902,600 A | 2/1990 | Tamagawa et al. | |
| 4,924,353 A | 5/1990 | Patraw | |
| 4,925,083 A | 5/1990 | Farassat et al. | |
| 4,955,523 A | 9/1990 | Carlommagno et al. | |
| 4,975,079 A | 12/1990 | Beaman et al. | |
| 4,982,265 A | 1/1991 | Watanabe et al. | |
| 4,998,885 A | 3/1991 | Beaman | |
| 4,999,472 A | 3/1991 | Neinast et al. | |
| 5,067,007 A | 11/1991 | Otsuka et al. | |
| 5,067,382 A | 11/1991 | Zimmerman et al. | |
| 5,083,697 A | 1/1992 | Difrancesco | |
| 5,095,187 A | 3/1992 | Gliga | |
| 5,133,495 A | 7/1992 | Angulas et al. | |
| 5,138,438 A | 8/1992 | Masayuki et al. | |
| 5,148,265 A | 9/1992 | Khandros et al. | |
| 5,148,266 A | 9/1992 | Khandros et al. | |
| 5,186,381 A | 2/1993 | Kim | |
| 5,189,505 A | 2/1993 | Bartelink | |
| 5,196,726 A | 3/1993 | Nishiguchi et al. | |
| 5,203,075 A | 4/1993 | Angulas et al. | |
| 5,214,308 A | 5/1993 | Nishiguchi et al. | |
| 5,220,489 A | 6/1993 | Barreto et al. | |
| 5,222,014 A | 6/1993 | Lin | |
| 5,238,173 A | 8/1993 | Ura et al. | |
| 5,241,454 A * | 8/1993 | Ameen ............... | H01L 23/4985 174/255 |
| 5,241,456 A * | 8/1993 | Marcinkiewicz ... | H01L 23/5384 174/250 |
| 5,316,788 A | 5/1994 | Dibble et al. | |
| 5,340,771 A | 8/1994 | Rostoker | |
| 5,346,118 A | 9/1994 | Degani et al. | |
| 5,371,654 A | 12/1994 | Beaman et al. | |
| 5,397,997 A | 3/1995 | Tuckerman et al. | |
| 5,438,224 A | 8/1995 | Papageorge et al. | |
| 5,455,390 A | 10/1995 | DiStefano et al. | |
| 5,468,995 A | 11/1995 | Higgins, III | |
| 5,494,667 A | 2/1996 | Uchida et al. | |
| 5,495,667 A | 3/1996 | Farnworth et al. | |
| 5,518,964 A | 5/1996 | DiStefano et al. | |
| 5,531,022 A | 7/1996 | Beaman et al. | |
| 5,536,909 A | 7/1996 | DiStefano et al. | |
| 5,541,567 A | 7/1996 | Fogel et al. | |
| 5,571,428 A | 11/1996 | Nishimura et al. | |
| 5,608,265 A | 3/1997 | Kitano et al. | |
| 5,615,824 A | 4/1997 | Fjelstad et al. | |
| 5,635,846 A | 6/1997 | Beaman et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,688,716 A | 11/1997 | DiStefano et al. | |
| 5,718,361 A | 2/1998 | Braun et al. | |
| 5,726,493 A | 3/1998 | Yamashita et al. | |
| 5,731,709 A | 3/1998 | Pastore et al. | |
| 5,736,780 A | 4/1998 | Murayama | |
| 5,766,987 A | 6/1998 | Mitchell et al. | |
| 5,787,581 A | 8/1998 | DiStefano et al. | |
| 5,801,441 A | 9/1998 | DiStefano et al. | |
| 5,802,699 A | 9/1998 | Fjelstad et al. | |
| 5,811,982 A | 9/1998 | Beaman et al. | |
| 5,821,763 A | 10/1998 | Beaman et al. | |
| 5,830,389 A | 11/1998 | Capote et al. | |
| 5,831,836 A | 11/1998 | Long et al. | |
| 5,839,191 A | 11/1998 | Economy et al. | |
| 5,854,507 A | 12/1998 | Miremadi et al. | |
| 5,898,991 A | 5/1999 | Fogel et al. | |
| 5,908,317 A | 6/1999 | Heo | |
| 5,912,505 A | 6/1999 | Itoh et al. | |
| 5,948,533 A | 9/1999 | Gallagher et al. | |
| 5,953,624 A | 9/1999 | Bando et al. | |
| 5,971,253 A | 10/1999 | Gilleo et al. | |
| 5,973,391 A | 10/1999 | Bischoff et al. | |
| 5,977,618 A | 11/1999 | DiStefano et al. | |
| 5,980,270 A | 11/1999 | Fjelstad et al. | |
| 5,989,936 A | 11/1999 | Smith et al. | |
| 5,994,152 A | 11/1999 | Khandros et al. | |
| 6,000,126 A | 12/1999 | Pai | |
| 6,002,168 A | 12/1999 | Bellaar et al. | |
| 6,032,359 A | 3/2000 | Carroll | |
| 6,038,136 A | 3/2000 | Weber | |
| 6,052,287 A | 4/2000 | Palmer et al. | |
| 6,054,337 A | 4/2000 | Solberg | |
| 6,054,756 A | 4/2000 | DiStefano et al. | |
| 6,077,380 A | 6/2000 | Hayes et al. | |
| 6,117,694 A | 9/2000 | Smith et al. | |
| 6,121,676 A | 9/2000 | Solberg | |
| 6,124,546 A | 9/2000 | Hayward et al. | |
| 6,133,072 A | 10/2000 | Fjelstad | |
| 6,145,733 A | 11/2000 | Streckfuss et al. | |
| 6,157,080 A | 12/2000 | Tamaki et al. | |
| 6,158,647 A | 12/2000 | Chapman et al. | |
| 6,164,523 A | 12/2000 | Fauty et al. | |
| 6,168,965 B1 | 1/2001 | Malinovich et al. | |

(56) References Cited

U.S. PATENT DOCUMENTS

| | | |
|---|---|---|
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,399,426 B1 | 6/2002 | Capote et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,486,545 B1 * | 11/2002 | Glenn ............... H01L 23/49827 |
| | | 257/686 |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,908,785 B2 * | 6/2005 | Kim ............... H01L 21/76898 |
| | | 257/E21.597 |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,276,799 B2 * | 10/2007 | Lee ............... H01L 21/76898 |
| | | 257/774 |
| 7,294,920 B2 * | 11/2007 | Chen ............... H01L 21/486 |
| | | 257/698 |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |

(56) References Cited

U.S. PATENT DOCUMENTS

| | | |
|---|---|---|
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,857,190 B2 | 12/2010 | Takahashi et al. |
| 7,880,290 B2 | 2/2011 | Park |
| 7,892,889 B2 | 2/2011 | Howard et al. |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,053,879 B2 | 11/2011 | Lee et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,372,741 B1 | 2/2013 | Co et al. |
| 8,404,520 B1 | 3/2013 | Chau et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 | 9/2014 | Chau et al. |
| 8,878,353 B2 | 11/2014 | Haba et al. |
| 8,907,466 B2 | 12/2014 | Haba |
| 8,927,337 B2 | 1/2015 | Haba et al. |
| 8,987,132 B2 | 3/2015 | Gruber et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,136,254 B2 | 9/2015 | Zhao et al. |
| 9,153,562 B2 | 10/2015 | Haba et al. |
| 9,224,717 B2 | 12/2015 | Sato et al. |
| 9,570,382 B2 | 2/2017 | Haba |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0096787 A1 | 7/2002 | Fjelstad |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Kamezos et al. |
| 2004/0124518 A1 | 7/2004 | Kamezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1* | 3/2005 | Vu .................. H01L 21/56 257/787 |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Kamezos |
| 2005/0133932 A1 | 6/2005 | Pohl et al. |
| 2005/0140265 A1 | 6/2005 | Hirakata |
| 2005/0146008 A1* | 7/2005 | Miyamoto ........ H01L 23/49572 257/686 |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |

(56) References Cited

U.S. PATENT DOCUMENTS

| | | |
|---|---|---|
| 2007/0013067 A1 | 1/2007 | Nishida et al. |
| 2007/0015353 A1 | 1/2007 | Craig et al. |
| 2007/0035015 A1* | 2/2007 | Hsu .................... H01L 23/5389 257/723 |
| 2007/0045803 A1 | 3/2007 | Ye et al. |
| 2007/0090524 A1 | 4/2007 | Abbott |
| 2007/0126091 A1 | 6/2007 | Wood et al. |
| 2007/0145563 A1* | 6/2007 | Punzalan ............ H01L 23/3121 257/686 |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0110667 A1* | 5/2008 | Ahn .................... H05K 1/162 174/257 |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1* | 7/2008 | Baek .................... H01L 23/5389 257/686 |
| 2008/0211084 A1 | 9/2008 | Chow et al. |
| 2008/0230887 A1 | 9/2008 | Sun et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1* | 2/2009 | Jiang .................... H01L 21/561 257/777 |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1* | 6/2009 | Haba .................... H01L 21/6835 257/777 |
| 2009/0166873 A1* | 7/2009 | Yang .................... H01L 24/24 257/758 |
| 2009/0189288 A1 | 7/2009 | Beaman et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1* | 9/2009 | Lee .................... H01L 21/6835 438/107 |
| 2009/0256229 A1 | 10/2009 | Ishikawa et al. |
| 2009/0260228 A1 | 10/2009 | Val |
| 2009/0261466 A1 | 10/2009 | Pagaila et al. |
| 2009/0302445 A1* | 12/2009 | Pagaila ................ H01L 23/3121 257/678 |
| 2009/0315579 A1 | 12/2009 | Beaman et al. |
| 2009/0316378 A1* | 12/2009 | Haba .................... H01L 23/3114 361/808 |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Haba et al. |
| 2010/0052135 A1 | 3/2010 | Shim et al. |
| 2010/0052187 A1* | 3/2010 | Lee .................... H01L 21/561 257/777 |
| 2010/0072588 A1* | 3/2010 | Yang .................. H01L 23/49816 257/676 |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0216281 A1* | 8/2010 | Pagaila ................ H01L 21/6835 438/107 |
| 2010/0224975 A1 | 9/2010 | Shin et al. |
| 2010/0232129 A1 | 9/2010 | Haba et al. |
| 2010/0237471 A1 | 9/2010 | Pagaila et al. |

(56) References Cited

U.S. PATENT DOCUMENTS

| | | | |
|---|---|---|---|
| 2010/0246141 A1* | 9/2010 | Leung | H01L 24/82 361/735 |
| 2010/0289142 A1 | 11/2010 | Shim et al. | |
| 2010/0314748 A1 | 12/2010 | Hsu et al. | |
| 2010/0320585 A1 | 12/2010 | Jiang et al. | |
| 2010/0327419 A1 | 12/2010 | Muthukumar et al. | |
| 2011/0057308 A1 | 3/2011 | Choi et al. | |
| 2011/0068453 A1 | 3/2011 | Cho et al. | |
| 2011/0115081 A1 | 5/2011 | Osumi | |
| 2011/0140259 A1 | 6/2011 | Cho et al. | |
| 2011/0147911 A1 | 6/2011 | Kohl et al. | |
| 2011/0156249 A1* | 6/2011 | Chang | H01L 23/481 257/737 |
| 2011/0175213 A1 | 7/2011 | Mori et al. | |
| 2011/0209908 A1* | 9/2011 | Lin | H01L 25/03 174/258 |
| 2011/0215472 A1* | 9/2011 | Chandrasekaran | H01L 24/73 257/738 |
| 2011/0220395 A1 | 9/2011 | Cho et al. | |
| 2011/0223721 A1 | 9/2011 | Cho et al. | |
| 2011/0237027 A1 | 9/2011 | Kim et al. | |
| 2011/0241192 A1 | 10/2011 | Ding et al. | |
| 2011/0241193 A1 | 10/2011 | Ding et al. | |
| 2011/0272449 A1 | 11/2011 | Pirkle et al. | |
| 2011/0272798 A1* | 11/2011 | Lee | H01L 25/0657 257/735 |
| 2012/0007232 A1 | 1/2012 | Haba | |
| 2012/0015481 A1 | 1/2012 | Kim | |
| 2012/0018885 A1 | 1/2012 | Lee et al. | |
| 2012/0020026 A1* | 1/2012 | Oganesian | H01L 23/5389 361/707 |
| 2012/0025365 A1 | 2/2012 | Haba | |
| 2012/0034777 A1* | 2/2012 | Pagaila | H01L 21/568 438/667 |
| 2012/0043655 A1 | 2/2012 | Khor et al. | |
| 2012/0056312 A1* | 3/2012 | Pagaila | H01L 21/561 257/684 |
| 2012/0061814 A1 | 3/2012 | Camacho et al. | |
| 2012/0063090 A1 | 3/2012 | Hsiao et al. | |
| 2012/0080787 A1 | 4/2012 | Shah et al. | |
| 2012/0086111 A1 | 4/2012 | Iwamoto et al. | |
| 2012/0086130 A1 | 4/2012 | Sasaki et al. | |
| 2012/0104595 A1 | 5/2012 | Haba et al. | |
| 2012/0104624 A1* | 5/2012 | Choi | H01L 21/561 257/774 |
| 2012/0119380 A1 | 5/2012 | Haba | |
| 2012/0145442 A1 | 6/2012 | Gupta et al. | |
| 2012/0146235 A1 | 6/2012 | Choi et al. | |
| 2012/0184116 A1 | 7/2012 | Pawlikowski et al. | |
| 2012/0280374 A1 | 11/2012 | Choi et al. | |
| 2012/0280386 A1 | 11/2012 | Sato et al. | |
| 2012/0326337 A1* | 12/2012 | Camacho | H01L 24/19 257/782 |
| 2013/0032944 A1* | 2/2013 | Sato | H01L 23/48 257/774 |
| 2013/0037802 A1* | 2/2013 | England | H01L 21/568 257/48 |
| 2013/0049218 A1 | 2/2013 | Gong et al. | |
| 2013/0049221 A1* | 2/2013 | Han | H01L 21/561 257/774 |
| 2013/0069222 A1* | 3/2013 | Camacho | H01L 23/49827 257/737 |
| 2013/0082399 A1 | 4/2013 | Kim et al. | |
| 2013/0093087 A1 | 4/2013 | Chau et al. | |
| 2013/0093088 A1 | 4/2013 | Chau et al. | |
| 2013/0093091 A1* | 4/2013 | Ma | H01L 21/76898 257/751 |
| 2013/0095610 A1 | 4/2013 | Chau et al. | |
| 2013/0105979 A1 | 5/2013 | Yu et al. | |
| 2013/0134588 A1 | 5/2013 | Yu et al. | |
| 2013/0182402 A1 | 7/2013 | Chen et al. | |
| 2013/0200533 A1 | 8/2013 | Chau et al. | |
| 2013/0234317 A1 | 9/2013 | Chen et al. | |
| 2013/0241083 A1 | 9/2013 | Yu et al. | |
| 2014/0021605 A1 | 1/2014 | Yu et al. | |
| 2014/0036454 A1 | 2/2014 | Caskey et al. | |
| 2014/0124949 A1 | 5/2014 | Paek et al. | |
| 2014/0220744 A1 | 8/2014 | Damberg et al. | |
| 2014/0264945 A1* | 9/2014 | Yap | H01L 24/96 257/777 |
| 2015/0017765 A1 | 1/2015 | Co et al. | |
| 2015/0044823 A1 | 2/2015 | Mohammed | |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2000323516 A | 11/2000 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 2004047702 A | 2/2004 |
| JP | 2004-172157 A | 6/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 | 12/2007 |
| JP | 2007335464 A | 12/2007 |
| JP | 200834534 A | 2/2008 |
| JP | 2008166439 A | 7/2008 |
| JP | 2008171938 A | 7/2008 |

(56) References Cited

FOREIGN PATENT DOCUMENTS

| | | | |
|---|---|---|---|
| JP | 2008251794 A | 10/2008 | |
| JP | 2008277362 A | 11/2008 | |
| JP | 2008306128 A | 12/2008 | |
| JP | 2009004650 A | 1/2009 | |
| JP | 2009-508324 A | 2/2009 | |
| JP | 2009044110 A | 2/2009 | |
| JP | 2009506553 | 2/2009 | |
| JP | 2009064966 A | 3/2009 | |
| JP | 2009088254 A | 4/2009 | |
| JP | 2009111384 A | 5/2009 | |
| JP | 2009528706 A | 8/2009 | |
| JP | 2009260132 A | 11/2009 | |
| JP | 2010103129 A | 5/2010 | |
| JP | 2010192928 A | 9/2010 | |
| JP | 2010199528 A | 9/2010 | |
| JP | 2010206007 A | 9/2010 | |
| JP | 2011514015 A | 4/2011 | |
| KR | 100265563 | 9/2000 | |
| KR | 20010061849 A | 7/2001 | |
| KR | 2001-0094894 A | 11/2001 | |
| KR | 10-0393102 | 7/2002 | |
| KR | 20020058216 A | 7/2002 | |
| KR | 20060064291 A | 6/2006 | |
| KR | 20080020069 A | 3/2008 | |
| KR | 100865125 B1 | 10/2008 | |
| KR | 20080094251 A | 10/2008 | |
| KR | 100886100 B1 | 2/2009 | |
| KR | 20090033605 A | 4/2009 | |
| KR | 20090123680 A | 12/2009 | |
| KR | 20100033012 A | 3/2010 | |
| KR | 20100062315 A | 6/2010 | |
| KR | 101011863 B1 | 1/2011 | |
| KR | 20120075855 A | 7/2012 | |
| KR | 20150012285 A | 2/2015 | |
| TW | 200539406 A | 12/2005 | |
| TW | 200810079 A | 2/2008 | |
| TW | 200849551 A | 12/2008 | |
| TW | 200933760 A | 8/2009 | |
| TW | 201023277 A | 6/2010 | |
| TW | 201250979 A | 12/2012 | |
| WO | 02/13256 A1 | 2/2002 | |
| WO | 03045123 A1 | 5/2003 | |
| WO | 2004077525 A2 | 9/2004 | |
| WO | 2006050691 A2 | 5/2006 | |
| WO | 2007101251 A2 | 9/2007 | |
| WO | 2008065896 A1 | 6/2008 | |
| WO | 2008120755 A1 | 10/2008 | |
| WO | 2009096950 A1 | 8/2009 | |
| WO | 2009158098 A2 | 12/2009 | |
| WO | 2010041630 A1 | 4/2010 | |
| WO | 2010101163 A1 | 9/2010 | |
| WO | 2013059181 A1 | 4/2013 | |
| WO | 2013065895 A1 | 5/2013 | |
| WO | 2014107301 A1 | 7/2014 | |

OTHER PUBLICATIONS

North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, dated Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.
International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC LTD.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 dated May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.

(56) References Cited

OTHER PUBLICATIONS

Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.
International Preliminary Report on Patentability, Chapter II, for Application No. PCT/US2014/055695 dated Dec. 15, 2015.
International Search Report and Written Opinion for Application No. PCT/US2014/014181 dated Jun. 13, 2014.
International Search Report and Written Opinion for Application No. PCT/US2014/050125 dated Feb. 4, 2015.
International Search Report and Written Opinion for Application No. PCT/US2014/050148 dated Feb. 9, 2015.
International Search Report and Written Opinion for Application No. PCT/US2014/055695 dated Mar. 20, 2015.
Partial International Search Report for Application No. PCT/US2014/014181 dated May 8, 2014.
Taiwanese Office Action for Application No. 103103350 dated Mar. 21, 2016.
U.S. Appl. No. 13/477,532, filed May 22, 2012.
Written Opinion for Application No. PCT/US2014/050125 dated Jul. 15, 2015.

* cited by examiner

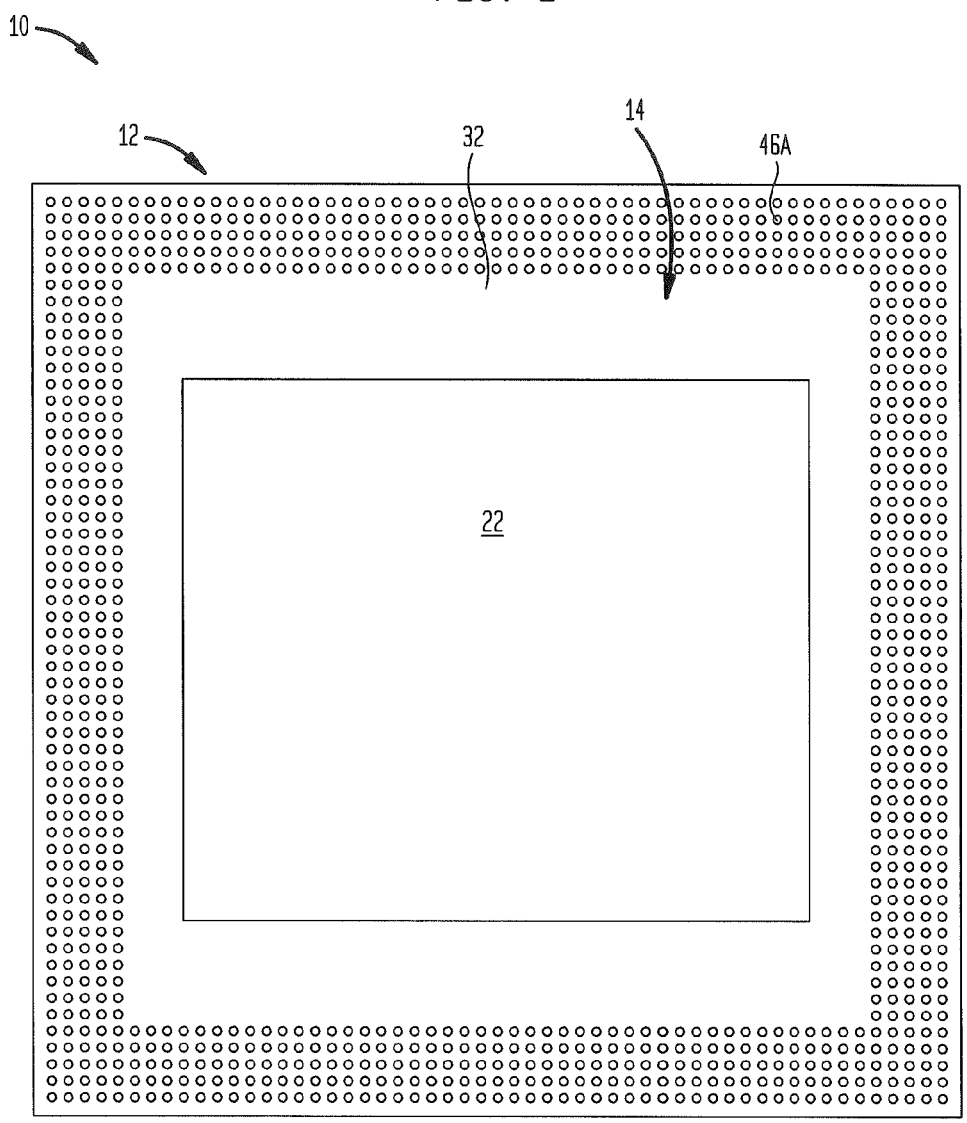

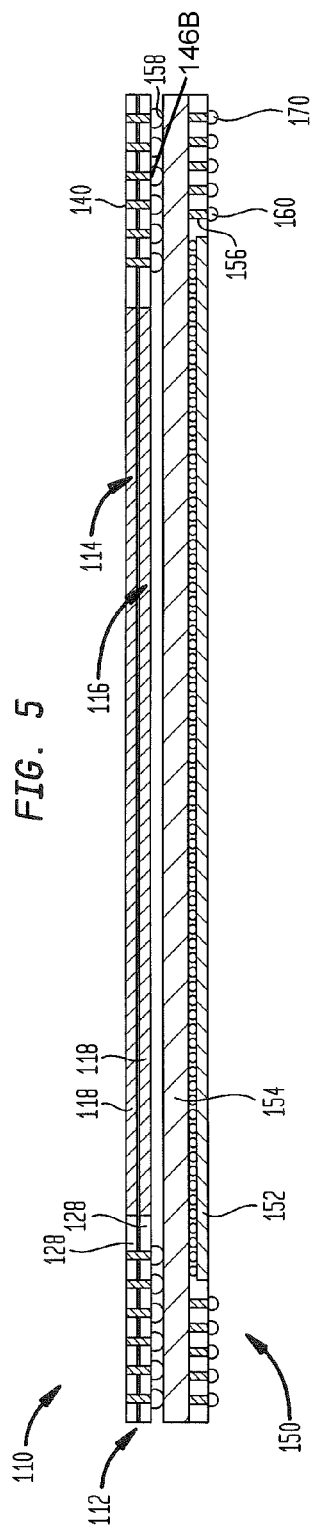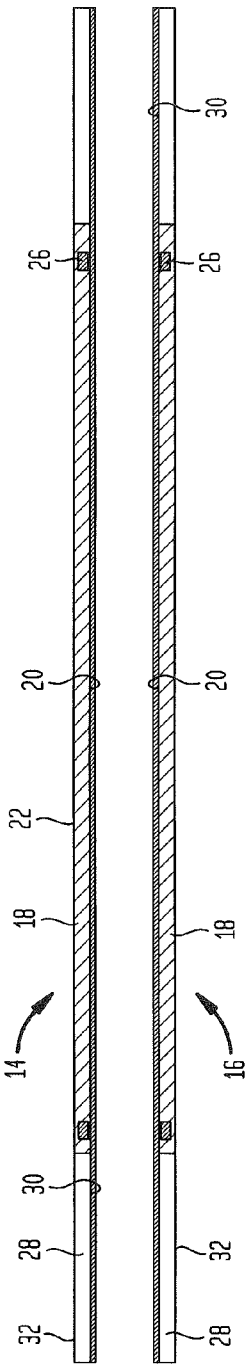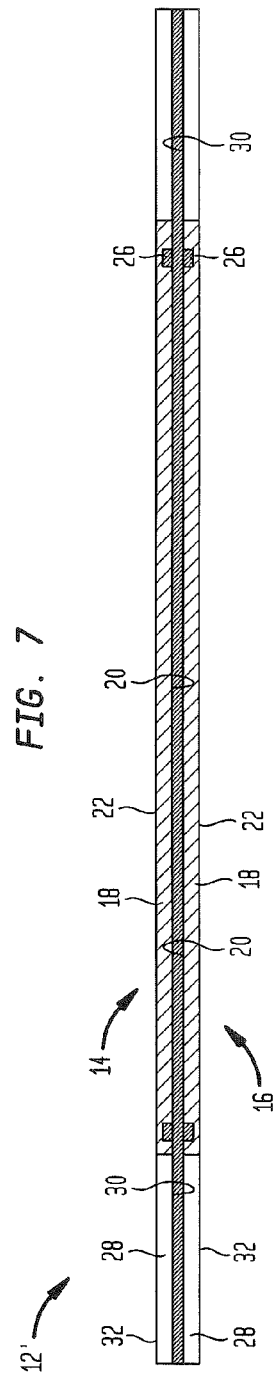

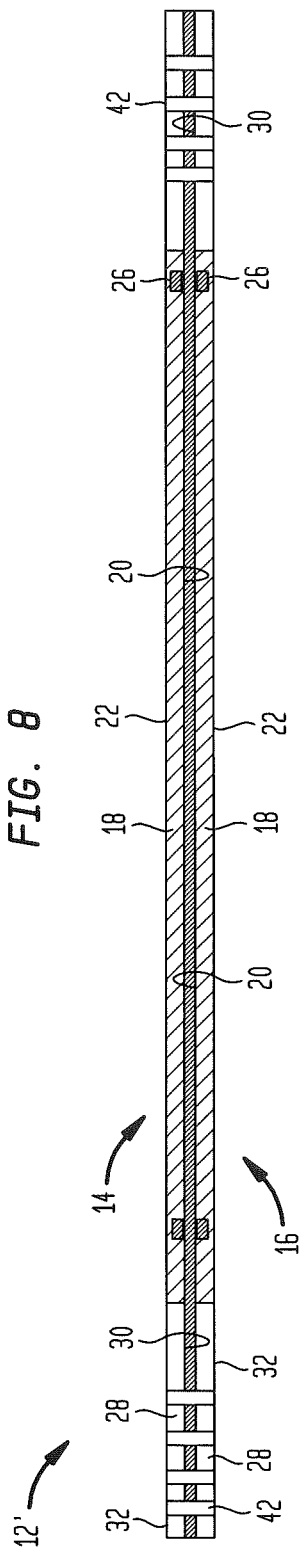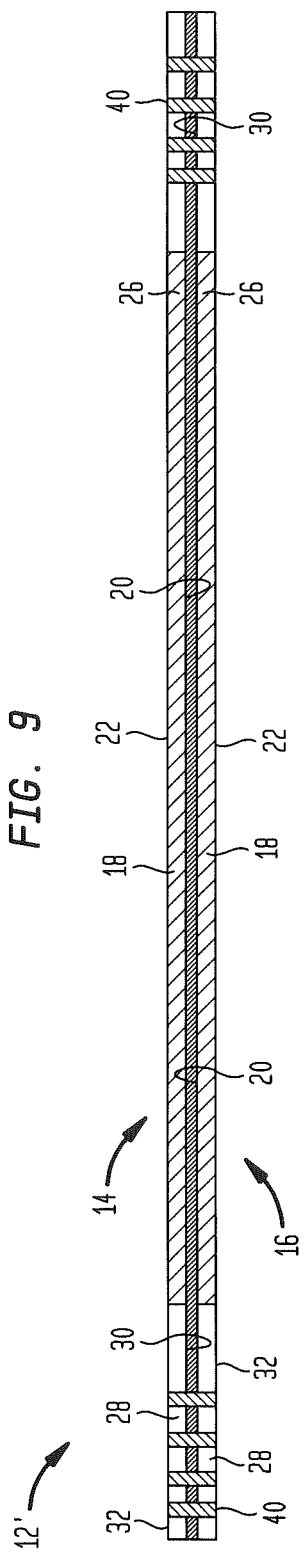

RECONSTITUTED WAFER-LEVEL PACKAGE DRAM WITH CONDUCTIVE INTERCONNECTS FORMED IN ENCAPSULANT AT PERIPHERY OF THE PACKAGE

CROSS-REFERENCE TO RELATED APPLICATION

This application is a divisional of U.S. application Ser. No. 13/563,085, filed on Jul. 31, 2012, now U.S. Pat. No. 9,391,008.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals which, in turn, are electrically connected to a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing may be a preferred fabrication method because it may provide a cost savings advantage, and because the footprint of each die package may be made identical, or nearly identical, to the size of the die itself, resulting in very efficient utilization of area on the printed circuit board to which the packaged die is attached. A die packaged in this manner is commonly referred to as wafer-level chip scale package or wafer-level chip sized package (WLCSP).

In order to save additional space on the substrate to which a packaged die is mounted, multiple chips may be combined in a single package by vertically stacking them. Each die in the stack must typically provide an electrical connection mechanism to either one or more other die in the stack, or to the substrate on which the stack is mounted, or to both. This allows the vertically stacked multiple die package to occupy a surface area on a substrate that is less than the total surface area of all the chips in the package added together. Such arrangements have, however, required the chips to be offset at least somewhat to provide access to the contacts of the upper chips for electrical connection thereto, as the routing for all of the multiple chips is done along the same surface of the package. This can also lead to complicated routing and for different paths to externally-connected logic between chips of the same package.

In light of the foregoing, certain improvements in multi-chip microelectronic packages can be made in order to improve electrical performance, particularly in assemblies which include such packages interconnected with one another or other packages.

SUMMARY OF THE INVENTION

An aspect of the present disclosure relates to a microelectronic package. The microelectronic package includes first and second encapsulated microelectronic elements, each of which includes a semiconductor die having a front face extending in first and second lateral directions, a plurality of contacts on the front face, a back face opposite the front face, and an edge surface extending between the front and back faces. An encapsulant contacts at least the edge surface of the semiconductor die and extends in at least one of the lateral directions from the edge surface. Electrically conductive elements extend from the contacts of the semiconductor die and over the front face in at least one of the lateral directions to locations overlying the encapsulant. The first and second microelectronic elements are affixed to one another such that one of the front or back surfaces of one of the first and second semiconductor dies is oriented towards and adjacent to one of the front or back surfaces of the other of the first and second semiconductor dies. The encapsulants of the first and second microelectronic elements define respective outwardly opposite surfaces. The package further includes a plurality of electrically conductive interconnects extending through the encapsulants of the first and second microelectronic elements. At least some of the conductive interconnects are electrically connected with at least one semiconductor die of the first and second microelectronic elements by the conductive elements. The conductive interconnects are exposed at the outwardly opposite surfaces.

In an example, the first and second microelectronic elements can be affixed to one another such that the front faces of the first and second semiconductor dies confront one another. In another arrangement, the first and second microelectronic elements can be affixed to one another such that the front face of the second semiconductor die confronts the back face of the first semiconductor die. In yet another example, the first and second microelectronic elements can be affixed to one another such that the back faces of the first and second semiconductor dies confront one another.

At least one of the microelectronic elements can be configured such that the major surface of the encapsulant is co-planar with the front face of the respective semiconductor die. Similarly, at least one of the microelectronic elements can be configured such that the second major surface of the encapsulant is co-planar with the back face of the corresponding semiconductor die.

The conductive interconnects can include laser-etched openings extending between the outwardly opposite surfaces of the encapsulants and intersecting respective conductive elements, the openings being at least partially filled with a conductive metal. First ones of the conductive interconnects can be electrically connected with the first semiconductor die by respective conductive elements, and second ones of the conductive interconnects can be electrically connected with the second semiconductor die by respective conductive elements. In a particular example, a quantity of the first conductive interconnects can be equal to a quantity of the second conductive interconnects. Further, all of the conductive interconnects can be either first conductive interconnects or second conductive interconnects.

In an example, the first and second semiconductor dies can be memory chips having a greater number of active devices configured to provide memory storage array function than any other function. Each of the memory chips can include a dynamic random access memory (DRAM) storage array.

A microelectronic assembly can include a first microelectronic package according to the above description and a second microelectronic package. The second microelectronic package can define a first surface having terminals exposed thereon and a second surface having package contacts exposed thereon. The second microelectronic package can further include a microelectronic element disposed between the first and second surface and electrically connected with terminals and the package contacts. A plurality of conductive joining elements can be joined between confronting ends of the conductive interconnects of the first microelectronic package and the terminals of the second microelectronic package.

The microelectronic element of the second package can be a logic chip having a greater number of active devices configured to provide logic function than any other function. The second microelectronic package can further include a substrate on which the microelectronic element is mounted. The substrate can include conductive elements electrically connected between the microelectronic element and the terminals.

The terminals of the second package can be ends of wire bonds having bases joined to respective ones of the conductive elements. In such an example, the second microelectronic package can further include an encapsulation layer formed over a surface of the substrate and over at least a portion of the microelectronic element. The encapsulation layer can further extend along edge surfaces of the wire bonds and can separate the wire bonds. The encapsulation layer can define the first surface of the second package, and the end surfaces of the wire bonds can be uncovered by the encapsulation layer on the second surface thereof.

In an example, first ones of the conductive interconnects can be electrically connected with the first microelectronic element by respective conductive elements, second ones of the conductive interconnects that can be electrically connected with the second microelectronic element by respective conductive elements, and third ones of the conductive interconnects that can be connected with neither of the first or second microelectronic elements. The first microelectronic package can further include a third microelectronic package overlying the first microelectronic package and having package contacts joined with the ends of the third conductive elements that are exposed on the first surface of the encapsulants.

In an exemplary configuration the second microelectronic package can include a substrate defining the first surface of the second package and having third surface opposite the first surface, the microelectronic element being mounted on the third surface.

A system can include comprising the microelectronic assembly described above and one or more electronic components.

Another aspect of the present disclosure relates to a microelectronic package including first and second encapsulated microelectronic elements. Each microelectronic element includes a semiconductor die having a front face extending in first and second lateral directions, a plurality of contacts on the front face, a back face opposite the front face, and an edge surface extending between the front and back faces. Each microelectronic element further has an encapsulant contacting at least the edge surface of the respective semiconductor die and extending in at least one of the lateral directions from the edge surface so as to define a major surface coplanar with or parallel to the front face of the semiconductor die, and electrically conductive elements including metallized vias extending from the contacts of the semiconductor die and along the front face. At least some of the conductive elements extend beyond the edge surface to locations overlying the major surface of the encapsulant. The first and second microelectronic elements are affixed to one another such that the front faces confront one another and the major surfaces confront one another. The package further includes a plurality of electrically conductive interconnects extending through the encapsulants of the first and second microelectronic elements in a direction away from the major surfaces. At least some of the conductive interconnects are electrically connected with at least one semiconductor die of the first and second microelectronic elements by the conductive elements. The conductive interconnects are exposed at first and second opposed surfaces of the encapsulants which are opposite the major surfaces.

Another aspect of the present disclosure relates to a method for making a microelectronic package. The method includes forming a plurality of electrically conductive interconnects through first and second encapsulated microelectronic elements. Each of the microelectronic elements includes a semiconductor die having a front face extending in first and second lateral directions, a plurality of contacts on the front face, a back face opposite the front face, and an edge surface extending between the front and back faces. An encapsulant contacts at least the edge surface of the respective semiconductor die and extends in at least one of the lateral directions from the edge surface. Electrically conductive elements extend from the contacts of the semiconductor die in at least one of the lateral directions to locations overlying the encapsulant. The first and second microelectronic elements are affixed to one another such that one of the front or back surfaces of one of the first and second semiconductor dies is oriented towards and adjacent to one of the front or back surfaces of the other of the first and second semiconductor dies. The encapsulants of the first and second microelectronic elements define respective outwardly opposite surfaces. The conductive interconnects are formed through the encapsulants of the first and second microelectronic elements such that at least some of the conductive interconnects are electrically connected with at least one semiconductor die of the first and second microelectronic by the conductive elements. The conductive interconnects are exposed at the outwardly opposite surfaces.

The conductive interconnects can be formed by laser etching openings through the encapsulants of the first and second microelectronic elements and through respective ones of the conductive elements and by at least partially filling the openings with a conductive metal.

In an example, method can further including affixing the first and second microelectronic elements to one another such that the front faces confront one another. In another example, the method can further include affixing the first and second microelectronic elements to one another such that the front face of the second microelectronic element confronts the back face of the first microelectronic element. In yet another example, the method can further include affixing the first and second microelectronic elements to one another such that the back faces confront one another.

The conductive interconnects can be formed to include first conductive interconnects that are connected by respective conductive elements to the first microelectronic element and second conductive interconnects that are connected by respective conductive elements to the second microelectronic element. A quantity of first conductive interconnects formed in the package can be equal to a quantity of second conductive vias formed in the package. The conductive interconnects can be further formed to include third conductive interconnects that are free from other electrical connections within the package.

The method can further include forming the electrically conductive elements that extend along a dielectric region overlying the respective front faces of the semiconductor dies and the first major surfaces of the encapsulants. Forming the electrically conductive elements can include forming the conductive elements on at least one of the first or second microelectronic elements prior affixing the microelectronic elements together. Additionally or alternatively, forming the electrically conductive elements can include forming the conductive elements on a dielectric region overlying at least one of the first or second microelectronic elements before affixing the microelectronic elements together.

Another aspect of the present disclosure relates to a method for making a microelectronic assembly. The method includes making a first microelectronic package by a steps including forming a plurality of electrically conductive interconnects through first and second encapsulated microelectronic elements. Each of the microelectronic elements includes a semiconductor die having a front face extending in first and second lateral directions, a plurality of contacts on the front face, a back face opposite the front face, and an edge surface extending between the front and back faces. An encapsulant contacts at least the edge surface of the respective semiconductor die and extends in at least one of the lateral directions from the edge surface. Electrically conductive elements including metalized vias extend from the contacts of the semiconductor die in at least one of the lateral directions to locations overlying the encapsulant. The first and second microelectronic elements are affixed to one another such that one of the front or back surfaces of one of the first and second semiconductor dies is oriented towards and adjacent to one of the front or back surfaces of the other of the first and second semiconductor dies. The encapsulants of the first and second microelectronic elements define respective outwardly opposite surfaces. The conductive interconnects are formed through the encapsulants of the first and second microelectronic elements such that at least some of the conductive interconnects are electrically connected with at least one semiconductor die of the first and second microelectronic by the conductive elements. The conductive interconnects are exposed at the outwardly opposite surfaces. The method further includes positioning the first microelectronic package over a second microelectronic package including a logic chip electrically connected with terminals exposed on a first surface of the second package and package contacts exposed on a second surface of the second microelectronic package. The method further includes joining ends of the conductive interconnects of the first microelectronic package that face the second microelectronic package with the terminals of the second microelectronic package using a plurality of conductive joining elements.

The method can further include positioning a third microelectronic package over the first microelectronic package, the third microelectronic package including terminals exposed on a surface thereof that is positioned to confront the first package. In such an example, the method can further include joining terminals of the third microelectronic package with ends of the conductive interconnects that are disposed toward the third microelectronic package.

The conductive interconnects can be formed to include first conductive interconnects connected by respective conductive elements to the first microelectronic element, second conductive interconnects connected by respective conductive elements to the second microelectronic element, and third conductive interconnects that are free from other electrical connections within the package. The terminals of the third microelectronic package can be joined with ends of the third conductive interconnects, the third conductive interconnects electrically connecting the third package to the second package.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 2 shows a top plan view of the package of FIG. 1;

FIG. 5 shows a microelectronic assembly according to a further embodiment of the present disclosure;

FIGS. 6-10 show various iterations of an in-process unit during method steps for making a microelectronic element according to another embodiment of the present disclosure;

DETAILED DESCRIPTION

Figure 1:
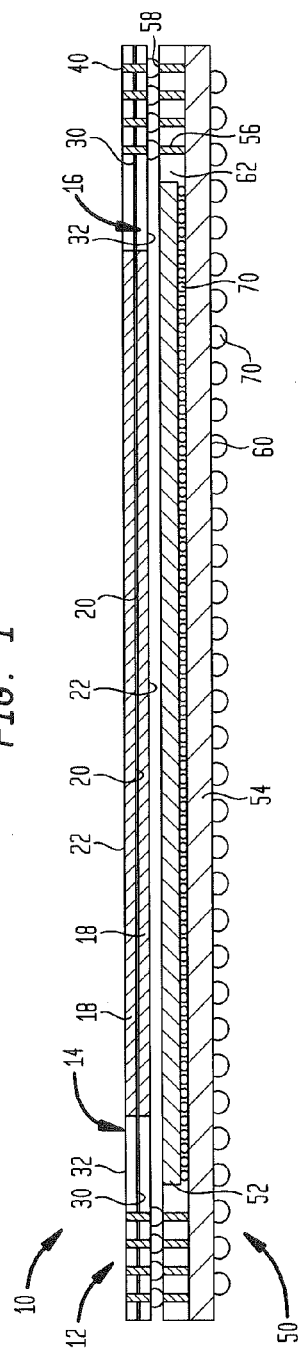
FIG. 1 shows a microelectronic assembly according to an embodiment of the present disclosure.

Turning now to the figures, where similar numeric references are used to indicate similar features, there is shown in FIG. 1 a microelectronic assembly 10 in the form a first microelectronic package 12 stacked over a second microelectronic package 50. In an example, assembly 10 can be in the form of a memory-on-logic assembly in which first package 12 is a memory package and second package 50 is a logic package, although the arrangements described herein can be used in arrangements with packages of different types or combinations of different types. Both first 12 and second 50 packages include one or more respective semiconductor dies 18 and 26 that themselves include a plurality of active devices. A memory package can be a package with semiconductor dies that have a majority of active devices configured for a memory storage array function. Similarly, a logic package can be one in which a majority of the active devices therein are configured to execute processor functions.

First microelectronic package 12 can include first and second encapsulated microelectronic elements 14 and 16. Each of the encapsulated microelectronic elements 14, 16 includes a semiconductor die 18. As mentioned above, these semiconductor dies 18 can be in the form of memory chips such as DRAM chips or the like. In other examples, the semiconductor dies 18 can be in the form of application-specific integrated circuit (ASIC) chips. Various combinations of ASIC and memory chips are also possible within package 12. Semiconductor die 18 further includes a front face 20 that extends in lateral directions and has element contacts 26 exposed thereon. A back face 22 is positioned opposite front face 20 and is generally parallel thereto. Edge surfaces 24 extend between front face 20 and back face 22 defining an outer periphery of die 18.

An encapsulant 28 at least partially surrounds semiconductor die 18. Encapsulant can be made from a dielectric material and can be molded or otherwise formed at least partially around die 18. Encapsulant 28 can contact one or more edge surfaces 24 of die 18 and can extend away therefrom in one or more lateral directions normal to the edge surfaces 24. In an example, front face 20 and back face 22 can be rectangular or square and four corresponding edge surfaces 24 can extend between respective sides of front and back faces 20,22. Encapsulant 28 can surround all four edge surfaces 24 and can extend away therefrom to give the microelectronic element 14 or 16 a rectangular shape. Encapsulant 18 includes first and second major surfaces 30 and 32 that are respectively associated with and parallel to front and back faces 20 and 22 of the semiconductor die 18. In some examples, encapsulant 28 can further contact back face 22 and extend away therefrom such that second major surface 32 overlies back face 32. In other embodiments, such as that shown in FIG. 1, front and back faces 20 and 22 can be uncovered by encapsulant 28 such that first major surface 30 extends substantially co-planar with front face 20 and/or second major surface 32 extends substantially co-planar with back face 22.

Figure 1A:
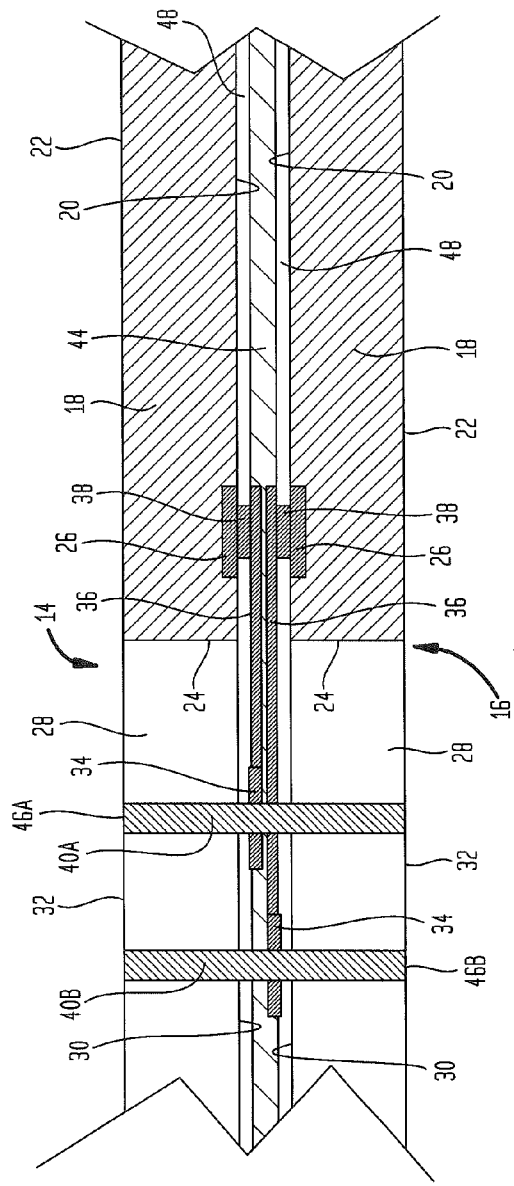
FIG. 1A shows a detail view of a microelectronic package included in the assembly of FIG. 1.

Each microelectronic element 14 and 16 can further include a dielectric region 48 overlying at least the front faces 20 of the semiconductor dies 18. As seen in FIG. 1A, the dielectric region 48 may extend beyond the edge surface 24 of the semiconductor die 18 to overlie first major surface 30 of the encapsulant 28. The dielectric region 48 may be partly or entirely made of any suitable dielectric material. For example, the dielectric region 48 may comprise a layer of flexible material, such as a layer of polyimide, BT resin or other dielectric material of the commonly used for making tape automated bonding ("TAB") tapes. Alternatively, the dielectric region 48 may comprise a relatively rigid, board like material such as a thick layer of fiber-reinforced epoxy, such as, Fr-4 or Fr-5 board. Regardless of the material employed, the dielectric region 30 may include a single layer or multiple layers of dielectric material.

As shown in the detail view of FIG. 1A, conductive elements can be connected with the contacts 26 of the semiconductor dies 18. Specifically, conductive vias 38 can extend through dielectric region 48 to connect with contacts 26 of semiconductor die 18. Additional conductive features such as traces 36 can connect with the conductive vias 38 and can extend away therefrom in one or more lateral directions along dielectric region 48 over face 20 and can further over first major surface 30 of encapsulant 28 to connect with one or more contacts 26 that can be positioned at various locations along first major surface 30. Such conductive element can be made from a conductive metal such as copper, gold, silver, nickel, aluminum, or various alloys thereof.

As further shown in FIG. 1A, first microelectronic element 14 and second microelectronic package 16 can be assembled together such that the front faces 22 of the respective semiconductor dies 18 confront one another. In such an arrangement the first major surfaces 30 of the respective encapsulants 28 can confront each other as well. Microelectronic elements can be joined together by a bonding layer 44 that can be an adhesive, a molded dielectric, or the like that can be bonded between the dielectric regions 48 of the microelectronic elements 14 and 16. Bonding layer 44 can be further configured to surround and insulate conductive elements, such as traces 36 and contacts 40. In the example shown, bonding layer 44 spaces apart microelectronic element 14 and 16 such that the routing patterns of the traces 18 do not interfere with one another. In other examples, the routing patterns of the respective first and second microelectronic elements 14,16 can be structured to be laterally spaced apart from each other such that the microelectronic elements 14 and 16 can be spaced closer together.

Conductive interconnects 40 can extend through the encapsulants 28 of both first and second microelectronic element 14 and 16 such that end surfaces 46A thereof are exposed on the second major surfaces 32 of the encapsulant 28 of first microelectronic element 14 and opposite end surfaces 46B are exposed on the second major surface 32 of the encapsulant 28 of second microelectronic element 16. Conductive interconnects 40 can also extend through and connect with respective ones of the conductive elements associated with either of the microelectronic elements 14 and 16. In the example of FIG. 1A, conductive element 40A connects with a pad 34 at the end of a trace 36 that extends along major surface 30 and front face 20 of microelectronic element 14 and connects to a respective contact of the semiconductor die 18 of microelectronic element 14. Similarly, conductive element 40B connects with a pad 34 at the end of another trace 36 that extends along major surface 30 and front face 20 of microelectronic element 16 and connects to a respective contact 26 of the semiconductor die 18 of microelectronic element 16. By this arrangement a number of connections can be made between the second major surfaces 32 of the microelectronic elements 14 and 16 and either semiconductor die 18. This can allow, for example, connection to the semiconductor dies 18 of both microelectronic elements 14 and 16 by ends 46B of the conductive interconnections 40 that are exposed at second major surface 32 of microelectronic element 16 or vice versa. Conductive interconnects can be metalized vias that are formed by plating a conductive metal into an opening that can be formed through the encapsulants and through portions of conductive elements disposed therebetween by etching, drilling or the like, as will be described in further detail below. Conductive metals for interconnects 40 can include copper, gold, silver, nickel, aluminum or various alloys thereof.

Conductive interconnects 40 can be arranged in any configuration or pattern within encapsulants 28. In the example shown in FIG. 2, conductive interconnects 40 are arranged in an area array pattern in which interconnects 40 are laid out in a grid pattern of various rows and columns of interconnects 40 within encapsulants 18 and surrounding semiconductor dies 18. The interconnects 40 within such an array can be spaced apart from one another according to a pitch of the array that can be less than, for example 500 microns and in another examples between about 250 and 300 microns. The array can be configured to align with an array of terminals 58 in second package 50, for example, to facilitate a particular electrical connection between packages by joining terminals 58 with, for example, ends 46B of conductive interconnects 40. This can allow for connection between, for example microelectronic element 52 and the semiconductor dies 18 of both microelectronic elements 14 and 16 in first package 12.

The conductive elements of the respective microelectronic elements 14 and 16 can be arranged such that only a single contact 26 on one of the semiconductor dies 18 is connected with a corresponding conductive interconnect 40. For example, the pads 34 of the respective microelectronic elements 14 and 16 can be arranged in different arrays or other pattern that each partially corresponds to the array of conductive interconnects 40. Such partially corresponding patterns can be different as between microelectronic elements 14 and 16 such that none of the pads 34 associated with microelectronic element 14 occupy a position of a pad 34 associated with microelectronic element 16, and vice versa. Numerous configurations are possible for such different patterns. In one example, all of the pads 34 of microelectronic element 16 can be positioned inside the array of pads 34 of microelectronic element 14. In another example, the pads 34 of microelectronic element 14 can alternate in an array with the pads 34 of microelectronic element 16, with further arrangements being possible. Traces 36 can be routed such that they do not contact any features within package 12 other than a single pad 34 and a single contact 26 on a corresponding semiconductor die 18.

Figure 3:
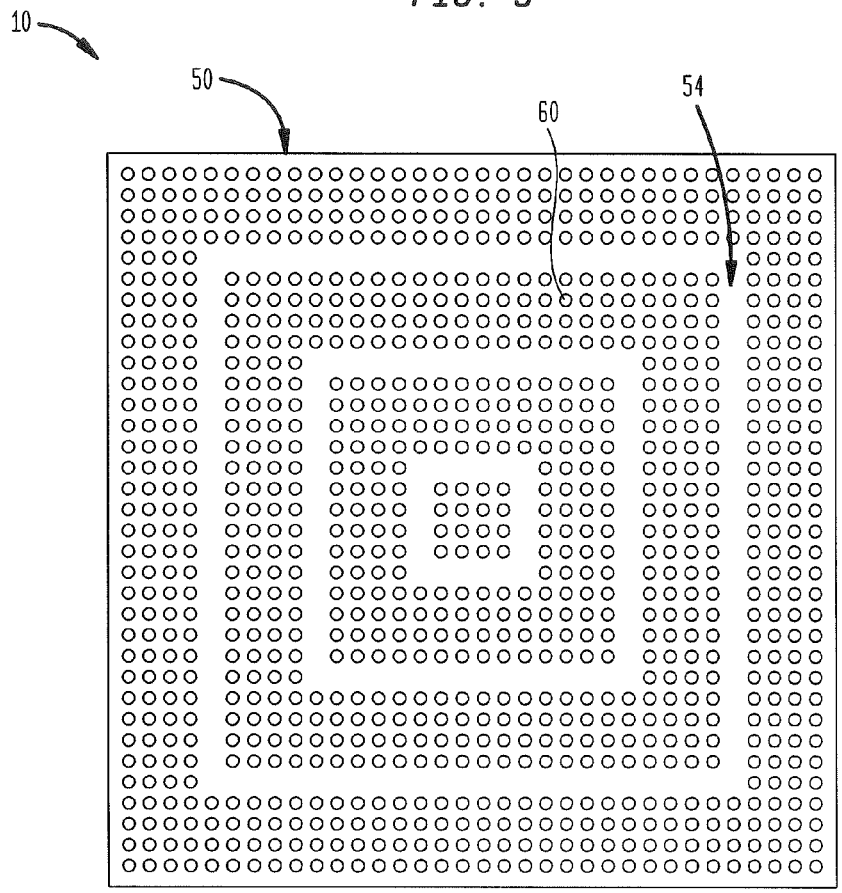
FIG. 3 shows a bottom plan view of the package of FIG. 1.

As mentioned previously, conductive interconnects 40 can be positioned to connect with terminals 29 of second package 50, which in an example can be a logic package. As shown in FIG. 1, second package 50 can be in the form of a microelectronic element 52 carried on a substrate 54 with terminals 58 on a surface of an encapsulant that overlies substrate. Terminals 58 can be end surfaces of interconnects 56 that extend from conductive elements that extend along a surface of the substrate 54 to connect with microelectronic element 52 by, for example, conductive masses 70. Interconnects can be in any of a number of configurations and can include conductive pins or posts. In another example, interconnects 56 can be in the form of wire bonds, as described in U.S. Pat. No. 7,391,121 to Otremba, in U.S. Pat. App. Pub. No. 2005/0095835 (describing a wedge-bonding procedure that can be considered a form of wire bonding), and in commonly-assigned U.S. patent application Ser. Nos. 13/462,158; 13/404,408; 13/405,108; 13/405,125; and Ser. No. 13/404,458, the disclosures of which are incorporated herein by reference in their entireties. Substrate 54 can include redistribution to connect package contacts exposed on the substrate 54 opposite terminals 58 with microelectronic element 52 to facilitate connection between assembly 10 and other microelectronic devices in a microelectronic system. In an embodiment, package contacts 60 can connect with terminals on a circuit panel or the like (not shown) by conductive joining masses. Such package contacts 60 can be arranged in a pattern or array as shown in FIG. 3 and can be input and output connections for assembly 10.

Figure 4:
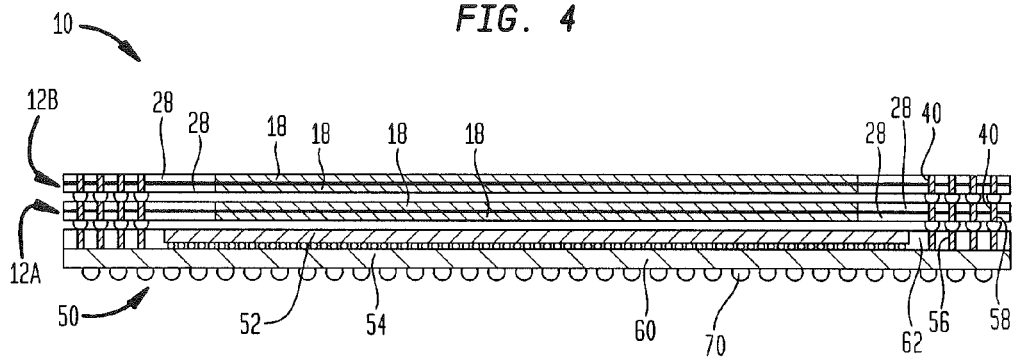
FIG. 4 shows a microelectronic assembly according to a further embodiment of the present disclosure.

As shown in FIG. 4 an additional package 12B can be stacked on top of package 12A. Package 12B can be of a similar configuration as package 12A, which itself is similar to package 12 described above with respect to FIGS. 1-3. In such an example, package 12A can be adapted to facilitate an electrical connection between package 12B and package 50. To accomplish this, some of the conductive interconnects 40 within package 12A can be unconnected with either of the semiconductor dies 18 within package 12A. Such interconnects 40 can further be unconnected with any conductive elements, such as pads 34 or traces 36 within package 12A. These unconnected interconnects 40 within package 12A can connect with conductive interconnects 40 within package 12B, which themselves can be connected with either of the semiconductor dies 18 therein in a manner similar to that discussed above with respect to package 12 in FIG. 1A. In a further example, some of the conductive interconnects 40 within package 12B can themselves be unconnected with either of the semiconductor dies 18 in package 12B and can, along with unconnected interconnects 40 within package 12A can facilitate an electrical connection between package 50 and a still further package (not shown) stacked on top of package 12B. The uppermost package in such a stacked arrangement can be similar to package 12A or 12B, as shown in FIG. 4 or can be another form of a packaged microelectronic element (or microelectronic elements) with contacts exposed at least on a surface that faces the conductive interconnects 40 of a package beneath it.

FIG. 5 shows an assembly 110 that is a variation of the assembly of FIG. 1. In particular, assembly 110 includes a first package 112 that is similar in construction to that of package 12 in FIGS. 1-3. Assembly 110 further includes a second package 150 that is similar to package 50 in FIGS. 1-4 but is configured such that the ends 158 of the interconnects 56 are disposed away from package 112 and act as contacts for connection of assembly 110 with external components, such as a circuit panel or the like. Accordingly, the contacts on substrate 154 opposite the microelectronic element 152 act as terminals 160 to which the ends 146B of the conductive interconnects 146 of package 112 are connected using conductive joining masses 70 or the like. In such an arrangement, interconnects 156 can be in the form of encapsulated wire bonds, as described above to achieve a fine-pitch for the contacts 160 that are the ends of the interconnects 156. Redistribution through substrate 154 (or layers thereof) can provide for the desired configuration of terminals 158 to connect with conductive interconnects 140. Further packages (not shown) can be included in the assembly 110 in a similar way to that described above with respect to FIG. 4.

FIGS. 6-10 show the various components of assembly 10 during steps of fabrication thereof in a method according to an embodiment of the present disclosure. In particular, FIG. 6 shows first microelectronic element 14 and second microelectronic element 16 prior to assembly together. Microelectronic elements 14 and 16 can be formed as reconstituted wafer-level packages. That is, they can be formed in a wafer with a plurality of semiconductor dies that are embedded in an encapsulant layer. The wafer can then be diced or segmented into individual microelectronic elements including, for example, a single semiconductor die with a portion of the encapsulant surrounding at least a portion thereof. Other process steps can be used to create the particular package, including grinding one or more surfaces of the encapsulant to create major surfaces 30 and 32 that are flush with the front 20 and back 22 faces of the semiconductor die 18, which themselves can be thinned by such a grinding process. Before or after segmentation, the conductive elements, including the pads 34, traces 36 and conductive vias 38 can be formed along front face 20 of the semiconductor die 18 and the first major surface 30 of the encapsulant 28 according to the principles discussed above. An additional dielectric layer can optionally be formed over the portions of first major surface 30 and front face 20 not covered by conductive elements.

As shown in FIG. 6, the microelectronic elements 14 and 16 can then be positioned such that front faces 20 and first major surfaces 30 confront one another with their respective conductive elements appropriately positioned with respect to each other as described above. The microelectronic elements 14 and 16 can then be bonded together by an adhesive layer or a curable dielectric material layer disposed between microelectronic elements 14 and 16. In some embodiments such a layer can intersperse between conductive elements when microelectronic elements 14 and 16 are moved together. Such bonding can result in the in-process unit 12' shown in FIG. 7.

The in-process unit of FIG. 7 can then be processed to form openings through the encapsulants 28 of the first and second microelectronic elements 14 and 16 and through desired portions of the conductive elements associated therewith. In an example, wherein the pads 34 associated with microelectronic elements 14 and 16 are arranged in an array when microelectronic elements 14 and 16 are assembled together, the openings 42 can be made through the pads 34 and the portions of the areas of the encapsulants 28 that overlie the pads 34. In the example shown, openings 42 can extend completely through in-process unit 12 such that they are open to second major surfaces 32 of both microelectronic elements 14 and 16. In other embodiments, such as when the package being made is intended as a topmost package in a stack the openings can extend from a single one of the second major surfaces 32 to a depth adequate to extend through the pads 34. Openings 42 can be made by drilling, etching or the like. Etching can be done using a chemical etchant or the like with a mask layer being at least temporarily over second major surfaces 32. In another example, openings 42 can be formed by laser etching. Laser etching can be advantageous because it can use specially-configured equipment that can locate and target the portions of in-process unit 12' for formation of holes 42 based on detection of pads 34.

Openings 42 can then be filled with a conductive metal, such as copper or other metals discussed above, to form conductive interconnects 40. This can be done by plating the conductive metal into the holes. Such plating can be done by electroplating or electroless plating and can be done after depositing a seed layer or the like within openings 42. When used such a seed layer can be conductive to allow for electrical connection between conductive interconnects 40 and pads 34 or other conductive elements. In some embodiments, the ends 46 of the conductive interconnects 40 can be planarized by grinding or the like so that they become substantially flush with second major surfaces 32. In other examples, contacts can be formed over the ends 46 of the interconnects 40 to provide additional area for connection to other components.

Figure 10:
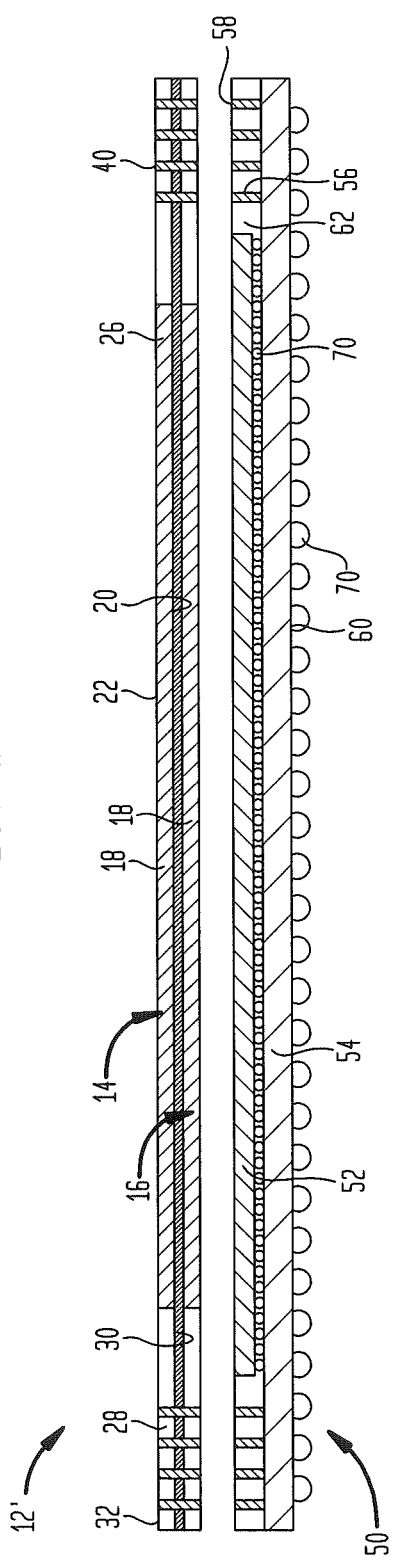

As shown in FIG. 10, package 12 is then aligned with package 50 such that the conductive interconnects 40, in particular the faces 46B thereof, align with the desired terminals 58 of package 50. In one example, package 50 can be formed as a package including encapsulated wire bond interconnects by any of the methods described in above-referenced commonly-assigned U.S. patent application Ser. Nos. 13/462,158; 13/404,408; 13/405,108; 13/405,125; and Ser. No. 13/404,458. Faces 46B of interconnects 40 are then joined with respective terminals 58 using conductive joining masses 70 such as solder balls or the like to form a package such as that shown in FIG. 1. Additional steps can be performed, including the formation of additional packages that are similar to package 12 that can be further assembled over package 12 with the conductive interconnects of such an additional package connected with certain ones of the conductive interconnects 40 of package 12, as described above with respect to FIG. 4.

Figure 11:
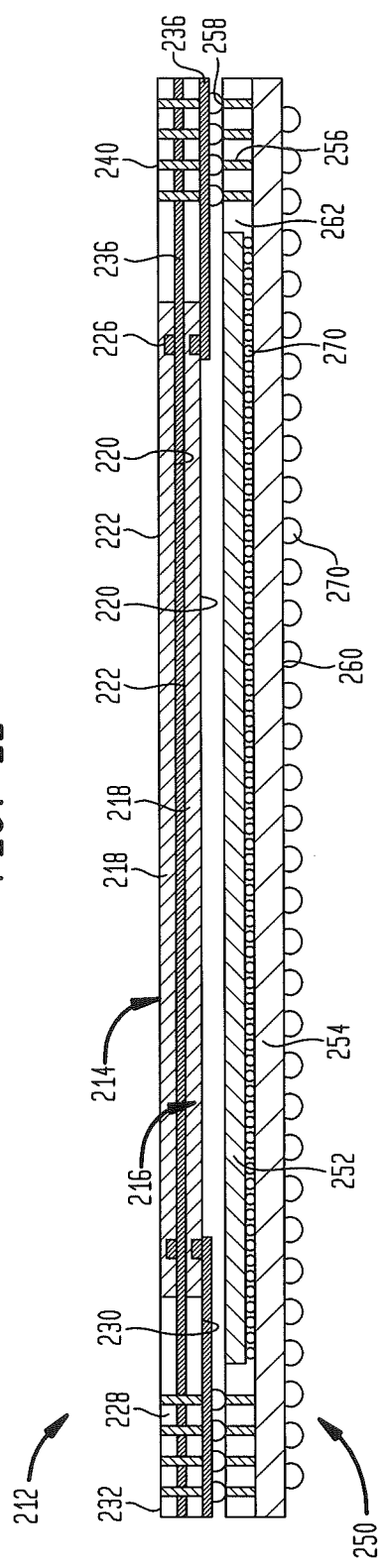
FIG. 11 shows a microelectronic assembly according to another embodiment of the present disclosure.

FIG. 11 shows a microelectronic assembly 210 that includes a package 212 assembled with another microelectronic package 250, wherein package 250 can be similar to package 50 discussed with respect to FIG. 1. Package 212 can be a variation of package 12 shown in FIG. 1 with many common characteristics. In particular, package 212 can include first and second microelectronic elements 214 and 216 that include semiconductor dies 218 with encapsulants 228 at least partially surrounding the semiconductor dies 218. Each microelectronic element 214 and 216 can include respective conductive elements including conductive vias 238 connected with contacts 226 of the respective semiconductor dies 218 and traces 36 extending along the front faces 20 and the first major surfaces 30 to pads 34. The first and second microelectronic elements 214 and 216 in the embodiment shown in FIG. 11 can be assembled together such that the first major surface 230 of microelectronic element 214 confronts the second major surface 232 of microelectronic element 216. Further, in such an arrangement front face 220 of the semiconductor die 218 of first microelectronic element 214 confronts the back surface 222 of the semiconductor die 218 of the second microelectronic element 216.

In the arrangement of FIG. 11, the locations of the conductive elements, in particular the pads 234 of the respective microelectronic packages 214 and 216 can be determined in a similar way to those of microelectronic package 12 of FIGS. 1-4. In particular, pads 234 can be positioned such that each conductive interconnect 240 passes through only one pad 234 of only one of the microelectronic elements 214 or 216. Also, as in package 12 of FIGS. 1-4 some of the conductive interconnects 240 can be free from electrical connections with either of the semiconductor dies 218 within package 212 and can be used to connect another package (not shown) stacked on top of package 212 with terminals 258 of package 250.

The method of fabricating assembly 210 can also be similar to the fabrication method of assembly 10 as described in FIGS. 6-10 but with microelectronic elements 214 and 216 being positioned in the back-to-front arrangement described above when being assembled together. Further, the conductive elements of second microelectronic element 216 can be formed after assembly thereof with first microelectronic element 214.

Figure 12:
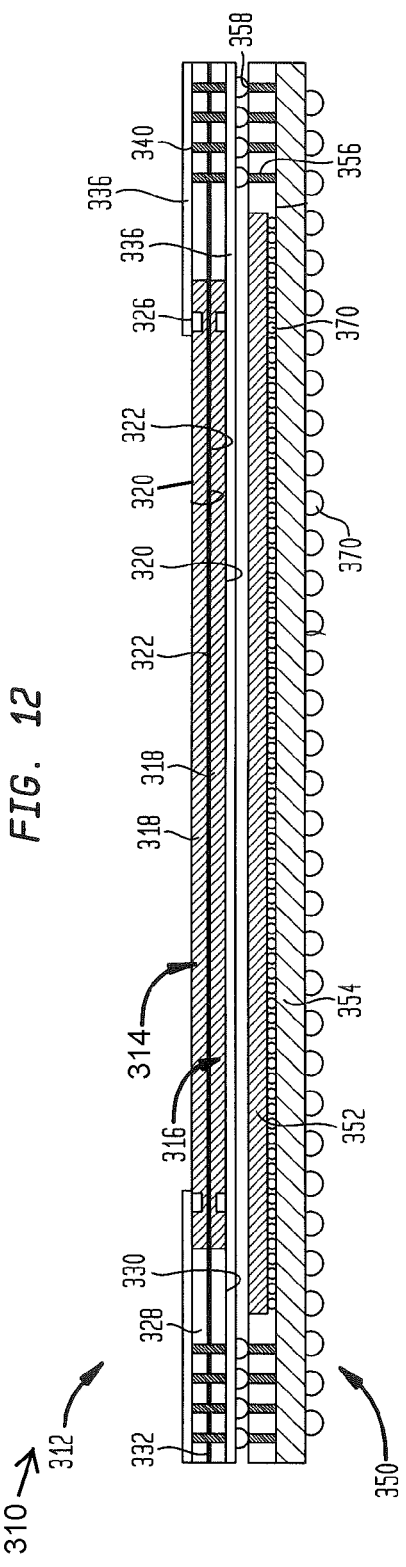
FIG. 12 shows a microelectronic assembly according to another embodiment of the present disclosure.

FIG. 12 shows another variation of a microelectronic assembly 310 that includes a package 312 assembled with another microelectronic package 350, wherein package 350 can be similar to package 50 discussed with respect to FIG. 1. Package 312 can be a variation of package 12 shown in FIG. 1 with many common characteristics. In particular, package 312 can include first and second microelectronic elements 314 and 316 that include semiconductor dies 318 with encapsulants 328 at least partially surrounding the semiconductor dies 318. Each microelectronic element 314 and 316 can include respective conductive elements including conductive vias 338 connected with contacts 326 of the respective semiconductor dies 318 and traces 336 extending along the front faces 320 and the first major surfaces 330 to pads 334. The first and second microelectronic elements 314 and 316 in the embodiment shown in FIG. 12 can be assembled together such that the second major surfaces 330 of the microelectronic elements 214 and 216 confront each other. Further, in such an arrangement the back faces 322 of the semiconductor dies 218 of the first and second microelectronic elements 214 and 216 can confront each other.

In the arrangement of FIG. 12, the locations of the conductive elements, in particular the pads 334 of the respective microelectronic packages 314 and 316 can be determined in a similar way to those of microelectronic package 12 of FIGS. 1-4. In particular, pads 334 can be positioned such that each conductive interconnect 340 passes through only one pad 334 of only one of the microelectronic elements 314 or 316. Also, as in package 12 of FIGS. 1-4 some of the conductive interconnects 340 can be free from electrical connections with either of the semiconductor dies 318 within package 312 and can be used to connect another package (not shown) stacked on top of package 312 with terminals 358 of package 350. In some variations of package 312 of FIG. 12, conductive pads 334 of second microelectronic element 316 are exposed on package 312 and confront terminals 358 of package 35 and, thus, can be directly connected therewith by solder balls 370 or the like. Accordingly, such pads 334 may not require any conductive interconnects 340 to be associated therewith. In such an example, conductive interconnects 340 can connect with pads of first microelectronic element 314 and can also be unconnected within package 312 for connection with additional packages (not shown) assembled above package 312.

The method of fabricating assembly 310 can also be similar to the fabrication method of assembly 10 as described in FIGS. 6-10 but with microelectronic elements 314 and 316 being positioned in the back-to-back arrangement described above when being assembled together. Further, the conductive elements of first and second microelectronic element 314 and 316 can be formed after being assembled together.

Figure 13:
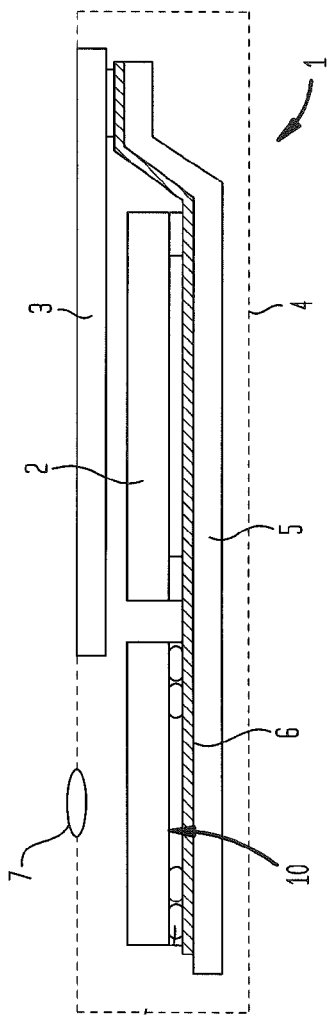
FIG. 13 shows a system that can include a microelectronic assembly according to various embodiments of the present disclosure.

The structures discussed above can be utilized in construction of diverse electronic systems. For example, a system 1 in accordance with a further embodiment of the invention includes microelectronic package 10, as described above with respect to FIGS. 1-4, in conjunction with other electronic components 2 and 3. In the example depicted, component 2 is a semiconductor chip whereas component 3 is a display screen, but any other components can be used. Of course, although only two additional components are depicted in FIG. 13 for clarity of illustration, the system may include any number of such components. The microelectronic package 10 as described above may be, for example, a microelectronic package as discussed above in connection with FIG. 1, or a structure incorporating plural microelectronic packages as discussed with reference to FIG. 4. Package 10 can further include any one of the embodiments described in FIG. 11 or 12. In a further variant, multiple variations may be provided, and any number of such structures may be used.

Microelectronic package 10 and components 2 and 3 are mounted in a common housing 4, schematically depicted in broken lines, and are electrically interconnected with one another as necessary to form the desired circuit. In the exemplary system shown, the system includes a circuit panel 5 such as a flexible printed circuit board, and the circuit panel includes numerous conductors 6, of which only one is depicted in FIG. 13, interconnecting the components with one another. However, this is merely exemplary; any suitable structure for making electrical connections can be used.

The housing 4 is depicted as a portable housing of the type usable, for example, in a cellular telephone or personal digital assistant, and screen 3 is exposed at the surface of the housing. Where microelectronic package 10 includes a light-sensitive element such as an imaging chip, a lens 7 or other optical device also may be provided for routing light to the structure. Again, the simplified system shown in FIG. 13 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making a microelectronic package, comprising: forming a plurality of electrically conductive interconnects through first and second encapsulated microelectronic elements, each of the microelectronic elements including:

a semiconductor die having a front face extending in first and second lateral directions, a plurality of contacts on the front face, a back face opposite the front face, and an edge surface extending between the front and back faces;

an encapsulant contacting at least the edge surface of the respective semiconductor die and extending in at least one of the lateral directions from the edge surface, the front face and the back face of the respective semiconductor die being uncovered by the encapsulant; and electrically conductive elements extending from the contacts of the semiconductor die in at least one of the lateral directions to locations overlying the encapsulant;

wherein the first and second microelectronic elements are affixed to one another by a bonding layer of dielectric material that extends between and contacts dielectric material at confronting surfaces of the first and second microelectronic elements such that one of the front or back surfaces of one of the first and second semiconductor dies is oriented towards and adjacent to one of the front or back surfaces of the other of the first and second semiconductor dies and at least some conductive elements of at least one of the microelectronic elements are abutting the bonding layer between the confronting surfaces, the encapsulants of the first and second microelectronic elements defining first and second opposite and outwardly facing surfaces, respectively, remote from the bonding layer, the first outwardly facing surface extending substantially co-planar with the front face or the back face of the semiconductor die of the first microelectronic element, and the second outwardly facing surface extending substantially co-planar with the front face or the back face of the semiconductor die of the second microelectronic element; and wherein the conductive interconnects are formed through the encapsulants of the first and second microelectronic elements, each conductive interconnect extending through an opening having a continuous interior surface extending from the first outwardly facing surface through the encapsulant of the first microelectronic element, and through the bonding layer and the encapsulant of the second microelectronic element to the second outwardly facing surface, wherein at least one of the conductive interconnects is electrically coupled with at least one of the conductive elements at a location adjacent the bonding layer and thereby electrically connected with at least one semiconductor die of the first and second microelectronic elements.

2. The method of claim 1, wherein the conductive interconnects are formed by laser etching the openings through the encapsulants of the first and second microelectronic elements and through respective ones of the conductive elements and by at least partially filling the openings with a conductive metal.

3. The method of claim 1, further including affixing the first and second microelectronic elements to one another such that the front faces confront one another.

4. The method of claim 1, further including affixing the first and second microelectronic elements to one another such that the front face of the second microelectronic element confronts the back face of the first microelectronic element.

5. The method of claim 1, further including affixing the first and second microelectronic elements to one another such that the back faces confront one another.

6. The method of claim 1, wherein the conductive interconnects are formed to include first conductive interconnects connected by respective conductive elements to the first microelectronic element and second conductive interconnects connected by respective conductive elements to the second microelectronic element.

7. The method of claim 6, wherein a quantity of first conductive interconnects formed in the package is equal to a quantity of second conductive vias formed in the package.

8. A method for making a microelectronic package, comprising:
   forming a plurality of electrically conductive interconnects through first and second encapsulated microelectronic elements, each of the microelectronic elements including:
   a semiconductor die having a front face extending in first and second lateral directions, a plurality of contacts on the front face, a back face opposite the front face, and an edge surface extending between the front and back faces;
   an encapsulant contacting at least the edge surface of the respective semiconductor die and extending in at least one of the lateral directions from the edge surface; and
   electrically conductive elements extending from the contacts of the semiconductor die in at least one of the lateral directions to locations overlying the encapsulant;
   wherein the first and second microelectronic elements are affixed to one another by a bonding layer of dielectric material that extends between and contacts dielectric material at confronting surfaces of the first and second microelectronic elements such that one of the front or back surfaces of one of the first and second semiconductor dies is oriented towards and adjacent to one of the front or back surfaces of the other of the first and second semiconductor dies and at least some conductive elements of at least one of the microelectronic elements are abutting the bonding layer between the confronting surfaces, the encapsulants of the first and second microelectronic elements defining first and second opposite and outwardly facing surfaces, respectively, remote from the bonding layer; and
   wherein the conductive interconnects are formed through the encapsulants of the first and second microelectronic elements, each conductive interconnect extending through an opening having a continuous interior surface extending from the first outwardly facing surface through the encapsulant of the first microelectronic element, and through the bonding layer and the encapsulant of the second microelectronic element to the second outwardly facing surface, wherein at least one of the conductive interconnects is electrically coupled with at least one of the conductive elements at a location adjacent the bonding layer and thereby electrically connected with at least one semiconductor die of the first and second microelectronic elements,
   wherein the conductive interconnects are formed to include first conductive interconnects connected by respective conductive elements to the first microelectronic element and second conductive interconnects connected by respective conductive elements to the second microelectronic element, and
   wherein the conductive interconnects are further formed to include third conductive interconnects that are free from other electrical connections within the package.

9. The method of claim 1, further including forming the electrically conductive elements.

10. The method of claim 9, wherein forming the electrically conductive elements includes forming the conductive elements on at least one of the first or second microelectronic elements prior to a step of affixing the microelectronic elements together.

11. The method of claim 9, wherein forming the electrically conductive elements includes forming the conductive elements on a dielectric region overlying at least one of the first or second microelectronic elements before a step of affixing the microelectronic elements together.

12. A method for making a microelectronic assembly, comprising:
   making a first microelectronic package by a method including:
   forming a plurality of electrically conductive interconnects through first and second encapsulated microelectronic elements, each of the microelectronic elements including:
   a semiconductor die having a front face extending in first and second lateral directions, a plurality of contacts on the front face, a back face opposite the front face, and an edge surface extending between the front and back faces;
   an encapsulant contacting at least the edge surface of the respective semiconductor die and extending in at least one of the lateral directions from the edge surface, the front face and the back face of the respective semiconductor die being uncovered by the encapsulant; and
   electrically conductive elements including metalized vias extending from the contacts of the semiconductor die in at least one of the lateral directions to locations overlying the encapsulant;
   wherein the first and second microelectronic elements are affixed to one another by a bonding layer of dielectric material that extends between and contacts dielectric material at confronting surfaces of the first and second microelectronic elements such that one of the front or back surfaces of one of the first and second semiconductor dies is oriented towards and adjacent to one of the front or back surfaces of the other of the first and second semiconductor dies and at least some conductive elements of at least one of the microelectronic elements are abutting the bonding layer between the confronting surfaces, the encapsulants of the first and second microelectronic elements defining first and second opposite and outwardly facing surfaces, respectively, remote from the bonding layer, the first outwardly facing surface extending substantially co-planar with the front face or the back face of the semiconductor die of the first microelectronic element, and the second outwardly facing surface extending substantially co-planar with the front face or the back face of the semiconductor die of the second microelectronic element; and wherein the conductive interconnects are formed through the encapsulants of the first and second microelectronic elements, each conductive interconnect extending through an opening having a continuous interior surface extending from the first outwardly facing surface through the encapsulant of the first microelectronic element, and through the bonding layer and the encapsulant of the second microelectronic element to the second outwardly facing surface, wherein at least one of the conductive interconnects is electrically coupled with at least one of the conductive elements at a location adjacent the bonding layer and thereby electrically connected with at least one semiconductor die of the first and second microelectronic elements;

positioning the first microelectronic package over a second microelectronic package including a logic chip electrically connected with terminals exposed on a first surface of the second package and package contacts exposed on a second surface of the second microelectronic package; and joining ends of the conductive interconnects of the first microelectronic package that face the second microelectronic package with the terminals of the second microelectronic package using a plurality of conductive joining elements.

13. The method of claim 12, further including positioning a third microelectronic package over the first microelectronic package, the third microelectronic package including terminals exposed on a surface thereof that is positioned to confront the first package, the method further including joining terminals of the third microelectronic package with ends of the conductive interconnects that are disposed toward the third microelectronic package.

14. The method of claim 13, wherein the conductive interconnects are formed to include first conductive interconnects connected by respective conductive elements to the first microelectronic element, second conductive interconnects connected by respective conductive elements to the second microelectronic element, and third conductive interconnects that are free from other electrical connections within the first microelectronic package, the terminals of the third microelectronic package are joined with ends of the third conductive interconnects, the third conductive interconnects electrically connecting the third microelectronic package to the second microelectronic package.

* * * * *